(12) United States Patent
Lee et al.

(10) Patent No.: US 12,519,479 B2
(45) Date of Patent: Jan. 6, 2026

(54) VOLTAGE-TO-TIME CONVERTER CIRCUIT AND SEMICONDUCTOR DEVICE INCLUDING THE SAME

(71) Applicants: SK hynix Inc., Icheon-si (KR); Korea Advanced Institute of Science and Technology, Daejeon (KR)

(72) Inventors: Changyeop Lee, Daejeon (KR); Seung-Tak Ryu, Daejeon (KR); Junho Cheon, Icheon-si (KR)

(73) Assignees: SK hynix Inc., Icheon-si (KR); Korea Advanced Institute of Science and Technology, Daejeon (KR)

( * ) Notice: Subject to any disclaimer, the term of this patent is extended or adjusted under 35 U.S.C. 154(b) by 172 days.

(21) Appl. No.: 18/496,244

(22) Filed: Oct. 27, 2023

(65) Prior Publication Data

US 2024/0388300 A1 Nov. 21, 2024

(30) Foreign Application Priority Data

May 19, 2023 (KR) .................. 10-2023-0065020

(51) Int. Cl.
*H03M 1/06* (2006.01)
*H03M 1/00* (2006.01)

(52) U.S. Cl.
CPC .................. *H03M 1/002* (2013.01)

(58) Field of Classification Search
CPC .............................. H03M 1/002; H03M 1/124
USPC .................. 341/122, 155, 136, 118
See application file for complete search history.

(56) References Cited

U.S. PATENT DOCUMENTS

| | | | | |
|---|---|---|---|---|
| 6,384,758 B1* | 5/2002 | Michalski | ............ | G11C 27/026 |
| | | | | 341/122 |
| 11,381,172 B2 | 7/2022 | Couleur et al. | | |
| 11,451,215 B1* | 9/2022 | Song | ................ | H03K 4/50 |
| 2014/0232367 A1* | 8/2014 | Kuo | ............ | H02M 3/1563 |
| | | | | 323/304 |

FOREIGN PATENT DOCUMENTS

KR 10-2016-0090951 A 8/2016

OTHER PUBLICATIONS

Zhengyu Chen et al., "A 65nm 3T Dynamic Analog RAM-Based Computing-in-Memory Macro and CNN Accelerator with Retention Enhancement, Adaptive Analog Sparsity and 44TOPS/W System Energy Efficiency" 2021 IEEE International Solid-State Circuits Conference (ISSCC), 2021, pp. 240-242.

(Continued)

*Primary Examiner* — Peguy Jean Pierre

(57) ABSTRACT

A voltage-to-time converter (VTC) circuit includes an input capacitor being charged according to an input voltage during a precharge operation; an output capacitor being charged during the precharge operation; a first transistor configured to discharge the output capacitor according to a voltage charged in the input capacitor during a first operation following the precharge operation; and a second transistor configured to charge the output capacitor according to the voltage charged in the input capacitor during a second operation following the first operation.

14 Claims, 7 Drawing Sheets

(56) References Cited

OTHER PUBLICATIONS

Jin-O Seo et al., "ARCHON: a 332.7TOPS/W 5b Variation-Tolerant Analog CNN Processor Featuring Analog Neuronal Computation Unit and Analog Memory" 2022 IEEE International Solid-State Circuits Conference (ISSCC), 2022, pp. 258-260.
Ehsan Rahiminejad et al., "A Low-Voltage High-Precision Time-Domain Winner-Take-All Circuit", IEEE Transactions on Circuits and Systems II: Express Briefs, Jan. 2020, vol. 67, No. 1, pp. 4-8.
Holly Pekau et al., "A CMOS integrated linear voltage-to-pulse-delay-time converter for time based analog-to-digital converters," 2006 IEEE International Symposium on Circuits and Systems, 2006, pp. 2373-2376.

* cited by examiner

VOLTAGE-TO-TIME CONVERTER CIRCUIT AND SEMICONDUCTOR DEVICE INCLUDING THE SAME

CROSS-REFERENCE TO RELATED APPLICATION

The present application claims priority under 35 U.S.C. § 119 (a) to Korean Patent Application No. 10-2023-0065020, filed on May 19, 2023, which is incorporated herein by reference in its entirety.

BACKGROUND

1. Technical Field

Various embodiments generally relate to a voltage-to-time converter circuit and a semiconductor device including the voltage-to-time converter circuit.

2. Related Art

Classification, using deep learning techniques, is an operation to determine a category to which an input value belongs.

For example, Cifar-10 dataset is a dataset consisting of 60,000 images and has 10 categories, and a convolutional neural network (CNN) can be used to classify an input image into one of the 10 categories.

For example, an input image is provided to one or more convolutional layers, and output data thereof is provided to a fully connected layer. An output of the fully connected layer has 10 outputs.

Conventionally, each of the 10 outputs is provided to an analog-to-digital converter (ADC) to be converted into a digital value, and then one category corresponding to the input image is determined by finding a largest value among digital values corresponding to the 10 outputs.

In another prior art, instead of using the ADC, a winner-take-all (WTA) circuit including a voltage-to-time converter (VTC) circuit and a deactivation circuit are used to determine one maximum value among multiple outputs.

In a conventional VTC circuit, the time changes nonlinearly according to an input voltage due to the characteristics of a transistor, which can result in a malfunction of the WTA circuit.

In addition, the conventional VTC circuit has a problem in that power efficiency is lowered because a time difference occurs only during a process of discharging a capacitor, after it has been charged.

SUMMARY

In accordance with an embodiment of the present disclosure, a voltage-to-time converter circuit may include an input capacitor being charged according to an input voltage during a precharge operation; an output capacitor being charged during the precharge operation; a first transistor configured to discharge the output capacitor according to a voltage charged in the input capacitor during a first operation following the precharge operation; and a second transistor configured to charge the output capacitor according to the voltage charged in the input capacitor during a second operation following the first operation.

In accordance with an embodiment of the present disclosure, a voltage-to-time converter circuit may include an input capacitor being charged according to an input voltage during a precharge operation; an output capacitor being discharged during the precharge operation; a first transistor configured to charge the output capacitor according to a voltage charged in the input capacitor during a first operation following the precharge operation; and a second transistor configured to discharge the output capacitor according to the voltage charged in the input capacitor during a second operation following the first operation.

In accordance with an embodiment of the present disclosure, a semiconductor device may include a voltage-to-time converter (VTC) circuit array including a plurality of VTC circuits that perform a first operation and a second operation, generate a plurality of time signals whose phase change times are determined according to a plurality of input voltages, respectively, and generate a plurality of extended time signals according to the plurality of input voltages by performing the first operation; a control circuit configured to control the first operation and the second operation and to determine a time to initiate the second operation according to the plurality of extended time signals; and a deactivation circuit array including a plurality of deactivation circuits and configured to generate a plurality of output signals, wherein, among the plurality of output signals, an output signal corresponding to a time signal with the earliest phase change time is activated, while the remaining output signals are deactivated.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate various embodiments, and explain various principles and advantages of those embodiments.

DETAILED DESCRIPTION

The following detailed description references the accompanying figures in describing illustrative embodiments consistent with this disclosure. The embodiments are provided for illustrative purposes and are not exhaustive. Additional embodiments not explicitly illustrated or described are possible. Further, modifications can be made to presented embodiments within the scope of teachings of the present disclosure. The detailed description is not meant to limit this disclosure. Rather, the scope of the present disclosure is defined in accordance with claims and equivalents thereof. Also, throughout the specification, reference to "an embodiment" or the like is not necessarily to only one embodiment, and different references to any such phrase are not necessarily to the same embodiment(s).

Figure 1:
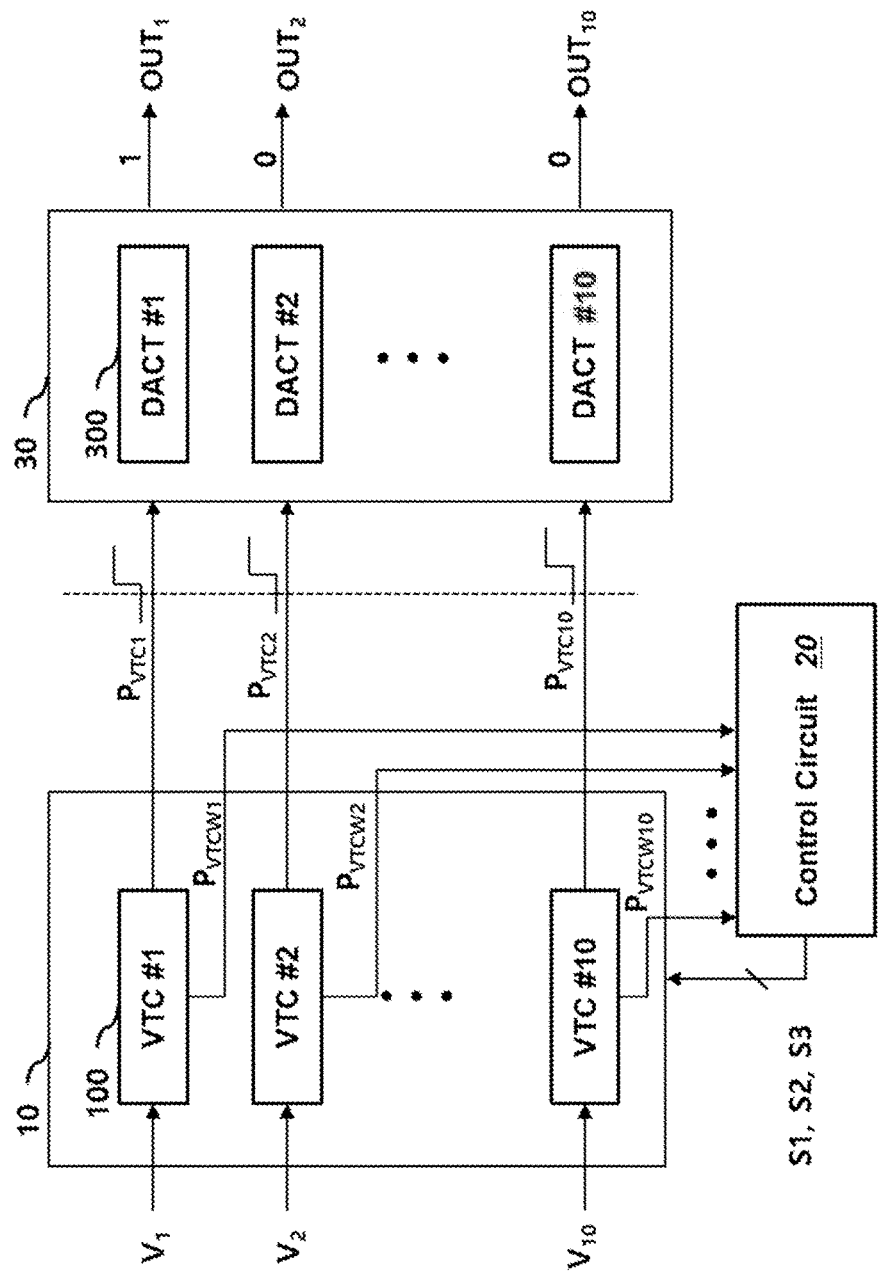
FIG. 1 illustrates a semiconductor device according to an embodiment of the present disclosure.

FIG. 1 is a block diagram illustrating a semiconductor device 1 according to an embodiment of the present disclosure.

The semiconductor device 1 includes a voltage-to-time converter (VTC) circuit array 10, a control circuit 20, and a deactivation circuit array 30.

In the present embodiment, the semiconductor device 1 generates a plurality of output signals, e.g., $OUT_1$ to $OUT_{10}$. Among the plurality of output signals $OUT_1$ to $OUT_{10}$, an output signal corresponding to a highest voltage among a plurality of input voltages $V_1$ to $V_{10}$ has a value of 1 and output signals corresponding to the remaining voltages among the plurality of input voltages $V_1$ to $V_{10}$ have a value of 0. In FIG. 1, it is assumed that the first input $V_1$ has the highest voltage among the plurality of input voltages $V_1$ to $V_{10}$. Therefore, the first output signal $OUT_1$ has the value of 1.

In this embodiment, it is assumed that the number of input voltages and the number of output signals corresponding thereto are 10, but the numbers are not limited thereto.

The VTC circuit array 10 includes a plurality of VTC circuits, each having the same configuration, and each VTC circuit converts a corresponding input voltage into a time signal.

For example, the first VTC circuit (VTC #1) 100 converts the first input voltage $V_1$ and outputs a first time signal $P_{VTC1}$.

FIG. 1 shows a plurality of time signals, e.g., $P_{VTC1}$ to $P_{VTC10}$, each transitioning from a low level to a high level after a corresponding delay time has elapsed. The delay time is determined based on a magnitude of a corresponding input voltage, with a reference time point indicated by a dotted line.

The first VTC circuit 100 further outputs a first extended time signal $P_{VTCW1}$ by converting the first input voltage $V_1$.

In this embodiment, each VTC circuit performs a first operation and a second operation, and the control circuit 20 generates a plurality of switching signals, e.g., S1, S2, and S3, for controlling the first operation and the second operation of each VTC circuit.

In particular, the control circuit 20 receives a plurality of extended time signals, e.g., $P_{VTCW1}$ to $P_{VTCW10}$, output from the VTC circuit array 10, and determines a time to initiate the second operation. In FIG. 1, the dotted line indicates the time to initiate the second operation.

The extended time signal $P_{VTCW}$ and the time signal $P_{VTC}$ will be described in detail below.

The deactivation circuit array 30 generates the plurality of output signals $OUT_1$ to $OUT_{10}$ from the plurality of time signals $P_{VTC1}$ to $P_{VTC10}$ output from the VTC circuit array 10.

The deactivation circuit array 30 includes a plurality of deactivation circuits, each having the same configuration.

For example, in the beginning, the first deactivation circuit (DACT #1) 300 maintains the first output signal $OUT_1$, which corresponds to the first input voltage $V_1$, at the high level.

The first deactivation circuit 300 outputs the first output signal $OUT_1$ at the high level when the first time signal $P_{VTC1}$, which corresponds to the first input voltage $V_1$, transitions to the high level before any of the other output signals $OUT_2$ to $OUT_{10}$ transitions to the high level.

For example, when the first output signal $OUT_1$ transitions to the high level, the second to $10^{th}$ deactivation circuits, which respectively correspond to the second to $10^{th}$ output signals $OUT_2$ to $OUT_{10}$, fix the levels of the corresponding output signals to the low level, regardless of whether the corresponding time signals $P_{VTC2}$ to $P_{VTC10}$ transition to the high level.

Figure 2:
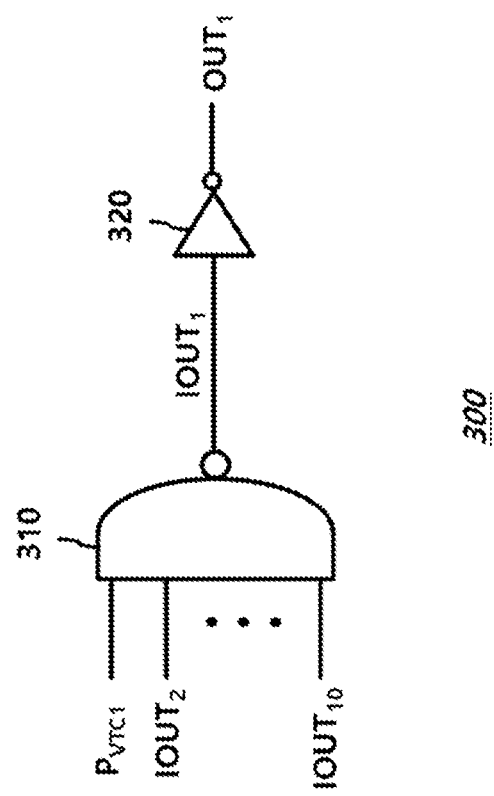
FIG. 2 illustrates a deactivation circuit according to an embodiment of the present disclosure.

FIG. 2 is a block diagram showing a deactivation circuit 300 according to an embodiment of the present disclosure. The deactivation circuit 300 shown in FIG. 2 may correspond to any of the plurality of deactivation circuits shown in FIG. 1. For example, FIG. 2 shows the first deactivation circuit 300 of FIG. 1.

The deactivation circuit 300 includes a NAND gate 310 and an inverter 320 connected to an output terminal of the NAND gate 310.

An output of the inverter 320 corresponds to the output signal $OUT_1$. An input signal of the inverter 320, that is, an output signal of the NAND gate 310 is referred to as an intermediate output signal $IOUT_1$.

The NAND gate 310 receives the time signal $P_{VTC1}$ and intermediate output signals $IOUT_2$ to $IOUT_{10}$ provided from the other deactivation circuits in the deactivation circuit array 30 of FIG. 1.

Since, at the beginning of operation, all time signals $P_{VTC1}$ to $P_{VTC10}$ input to the plurality of deactivation circuits are at the low level, the intermediate output signals $IOUT_1$ to $IOUT_{10}$ are at the high level, and the output signals $OUT_1$ $OUT_{10}$ are at the low level.

After that, if the time signal $P_{VTC1}$ transitions to the high level first, the intermediate output signal $IOUT_1$ transitions to the low level, and the output signal $OUT_1$ transitions to the high level.

Then, since the intermediate output signal $IOUT_1$, which is at the low level, is input to the remaining deactivation circuits, the output signals $OUT_2$ $OUT_{10}$ from the remaining deactivation circuits are fixed to the low level, regardless of levels of their corresponding time signals $P_{VTC2}$ to $P_{VTC10}$.

Figure 3:
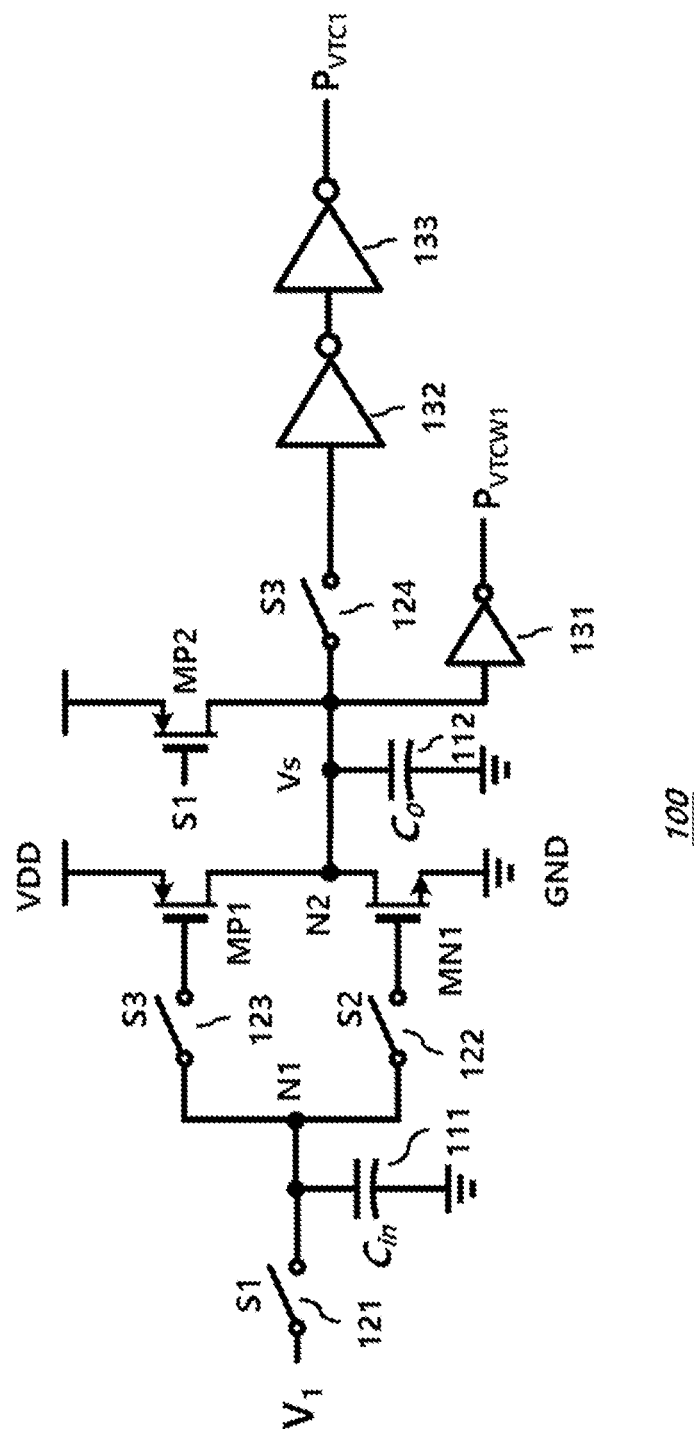
FIG. 3 illustrates a voltage-to-time converter circuit according to an embodiment of the present disclosure.

FIG. 3 is a circuit diagram showing a VTC circuit 100 according to an embodiment of the present disclosure. The VTC circuit 100 shown in FIG. 3 may correspond to any of the plurality of VTC circuits shown in FIG. 1. For example, FIG. 3 shows the first VTC circuit 100 of FIG. 1.

The VTC circuit 100 includes an input capacitor 111 connected between a first node N1 and a ground node GND, and an output capacitor 112 connected between a second node N2 and the ground node GND. The capacitance of the input capacitor 111 is expressed as $C_{in}$, and the capacitance of the output capacitor 112 is expressed as Co.

The VTC circuit 100 further includes a first PMOS transistor MP1 having a source connected to a power supply node VDD and a drain connected to the second node N2, and a first NMOS transistor MN1 having a source connected to the ground node GND and a drain connected to the second node N2.

The VTC circuit 100 further includes a second PMOS transistor MP2 having a source connected to the power supply node VDD and a drain connected to the second node N2.

The VTC circuit 100 further includes a first switch 121 providing the input voltage $V_1$ to the first node N1, a second switch 122 connecting the first node N1 to a gate of the first NMOS transistor MN1, a third switch 123 connecting the first node N1 to a gate of the first PMOS transistor MP1, and a fourth switch 124 having one terminal connected to the second node N2.

The VTC circuit 100 further includes a first inverter 131 connected to the second node N2, and a second inverter 132 and a third inverter 133 connected in series to the other terminal of the fourth switch 124.

The first switch 121 is controlled by the first switching signal S1, the second switch 122 is controlled by the second switching signal S2, the third switch 123 and the fourth switch 124 are controlled by the third switching signal S3.

The second PMOS transistor MP2 is controlled by the first switching signal S1.

Figure 4B:
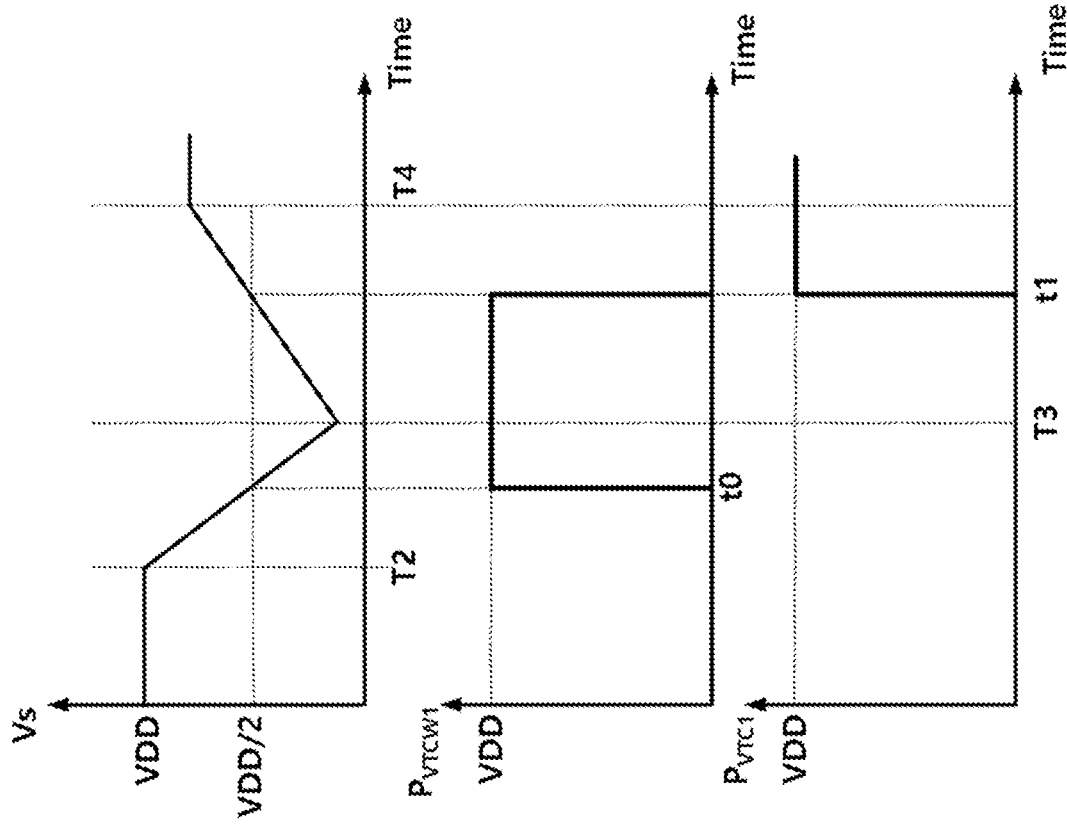
FIGS. 4A and 4B are graphs showing an operation of a voltage-to-time converter circuit of FIG. 3.
Figure 4A:
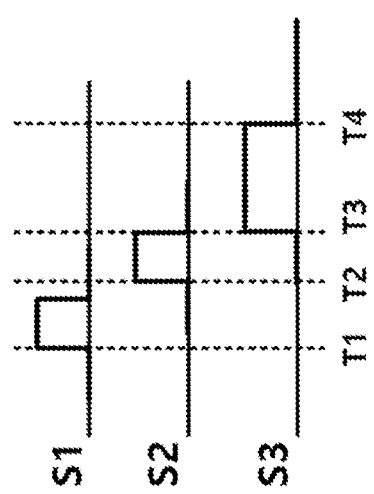

FIGS. 4A and 4B are graphs showing an operation of the VTC circuit 100 of FIG. 3.

FIG. 4A shows the first switching signal S1, the second switching signal S2, and the third switching signal S3, and FIG. 4B shows an output voltage Vs at the second node N2, the extended time signal $P_{VTCW1}$, and the time signal $P_{VTC1}$ when the first to the third switching signals S1 to S3 shown FIG. 4A are provided to the VTC circuit 100 of FIG. 3.

The control circuit 20 of FIG. 1 controls the first switching signal S1, the second switching signal S2, and the third switching signal S3.

The first switching signal S1 is a pulse signal transitioning to the high level at a time T1, the second switching signal S2 is a pulse signal transitioning to the high level at a time T2 after the time T1, and the third switching signal S3 is a pulse signal transitioning to the high level at a time T3 after the time T2.

A precharge operation of the input capacitor 111 and the output capacitor 112 is performed according to the first switching signal S1, and a first operation of the VTC circuit 100 is performed when the second switching signal S2 is at the high level, and a second operation of the VTC circuit 100 is performed when the third switching signal S3 is at the high level.

In this embodiment, it is preferable that the first operation and the second operation do not overlap, and accordingly, it is desirable that the second switching signal S2 transitions to the low level when the third switching signals S3 transitions to the high level.

The input capacitor 111 is charged when the first switching signal S1 is at the high level. In the present embodiment, it is assumed that a period in which the first switching signal S1 is at the high level is long enough so that a voltage of the first node N1 becomes equal to the input voltage $V_1$ after charging the input capacitor 111.

When the first switching signal S1 is at the low level before the first switching signal S1 transitions to the high level, the second PMOS transistor MP2 is turned on to precharge the output capacitor 112. In this embodiment, it is assumed that a period in which the first switching signal S1 is at the low level is sufficiently long so that the output voltage Vs becomes equal to the power supply voltage VDD.

When the second switching signal S2 transitions to the high level at the time T2, the second switch 122 is turned on to apply the input voltage $V_1$ to the gate of the first NMOS transistor MN1, and thus current corresponding to the input voltage $V_1$ flows through the NMOS transistor MN1 to discharge the output capacitor 112. As a result, a level of the output voltage Vs decreases.

After that, when the third switching signal S3 transitions to the high level at the time T3, the third switch 123 is turned on to apply the input voltage $V_1$ to the gate of the first PMOS transistor MP1, and thus current corresponding to the input voltage $V_1$ flows through the first PMOS transistor MP1 to charge the output capacitor 112. As a result, the level of the output voltage Vs increases.

Since a time when the third switching signal S3 transitions to the high level is substantially the same as a time when the second switching signal S2 transitions to the low level, the output voltage Vs decreases between the time T2 and the time T3 and begins to increase at the time T3, as shown in FIG. 4B.

At a time T4, the third switching signal S3 transitions to the low level and thus the third switch 123 is turned off. After the time T4, the output voltage Vs maintains its level as determined at the time T4.

The first inverter 131 inverts the output voltage Vs and outputs the extended time signal $P_{VTCW1}$ corresponding to the input voltage $V_1$.

Accordingly, as shown in FIG. 4B, the extended time signal $P_{VTCW1}$ is generated as a high-level pulse during a period between a time to and a time t1, in which the output voltage Vs is lower than a threshold voltage of the inverter 131. In this embodiment, it is assumed that the threshold voltage is VDD/2.

The second inverter 132 and the third inverter 133 sequentially invert the output voltage Vs during a period in which the third switching signal S3 is at the high level to generate the time signal $P_{VTC1}$ corresponding to the input voltage $V_1$.

Accordingly, the time signal $P_{VTC1}$ has a waveform transitioning to the high level at the time t1.

After the time T2, a slope of the output voltage Vs varies according to the magnitude of the input voltage $V_1$. For example, as the magnitude of the input voltage $V_1$ becomes smaller, discharging current flowing through the first NMOS transistor MN1 becomes smaller and charging current flowing through the first PMOS transistor MP1 becomes larger, so that the time to gets farther from the time T2 and the time t1 gets closer to the time T3.

In this embodiment, the time T3 at which the second operation starts is controlled by the control circuit 20.

If a period for performing the first operation is significantly long, it is difficult to make a sufficient change in the level of the output voltage Vs according to the input voltage $V_1$ at the time when the second operation starts because the output capacitor 112 is fully discharged regardless of the level of the input voltage $V_1$. Accordingly, a problem may occur in that the time t1 at which the time signal $P_{VTC1}$ transitions to the high level is not changed sufficiently by the input voltage $V_1$.

Accordingly, in the present embodiment, the control circuit 20 observes the plurality of extended time signals $P_{VTCW1}$ to $P_{VTCW10}$ respectively corresponding to the plurality of input voltages $V_1$ to $V_{10}$, and when the number of extended time signals transitioning to the high level becomes greater than or equal to a predetermined number, for example, 5, the first operation may be terminated and the second operation may start.

The control circuit 20 may control the time T4, at which the second operation is terminated.

As shown in FIGS. 4A and 4B, when a certain time period has elapsed after the time T3, one of the extended time signals $P_{VTCW1}$ to $P_{VTCW10}$ transitions to the low level. Consequently, a corresponding time signal transitions to the high level.

The control circuit 20 may end the second operation by transitioning the third switching signal S3 to the low level when a predetermined number of extended time signals transition to the low level. The time T4 is determined as a time when the predetermined number of extended time signals transition to the low level.

As described above, in this embodiment, since the phase transition of the time signal depends both on the discharging operation by the first NMOS transistor MN1 and on the charging operation by the first PMOS transistor MP1, the linearity according to the input voltage is improved.

Figure 5:
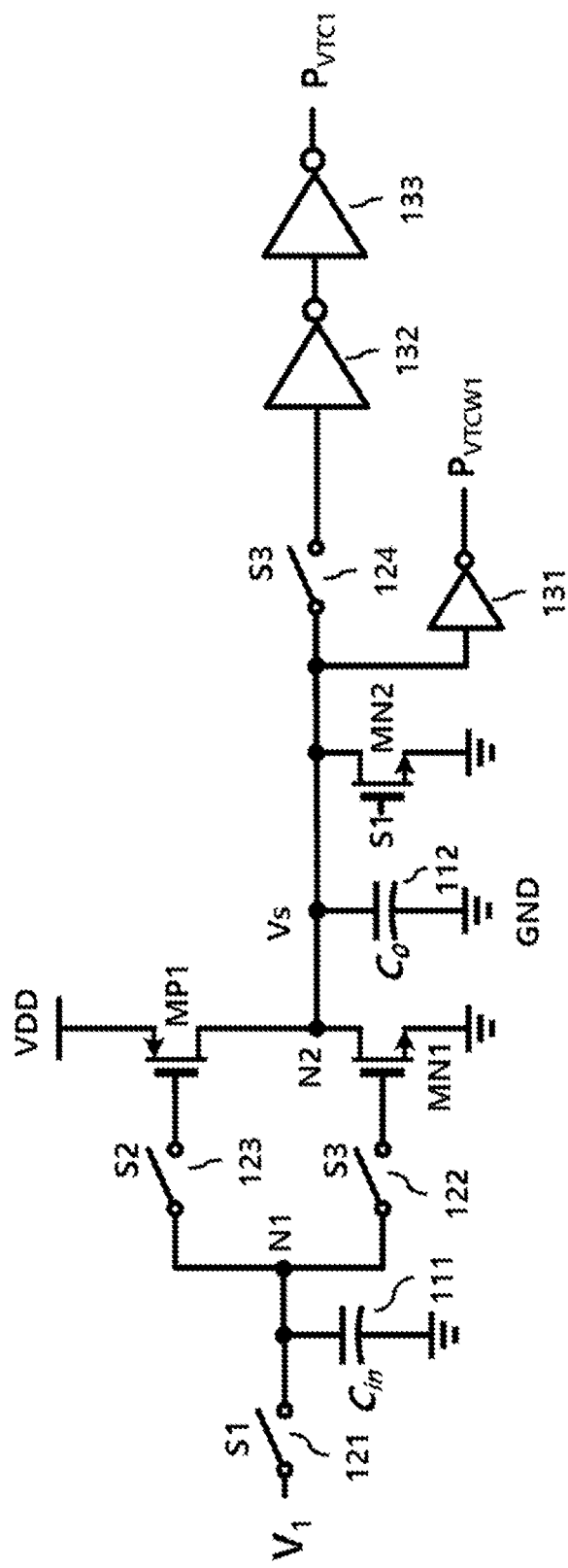
FIG. 5 illustrates a voltage-to-time converter circuit according to another embodiment of the present disclosure.

FIG. 5 is a circuit diagram showing a VTC circuit 100-1 according to another embodiment of the present disclosure. In FIG. 5, components identical to those in FIG. 3, are indicated by the same reference numerals.

The VTC circuit 100-1 includes an input capacitor 111 connected between a first node N1 and a ground node GND, and an output capacitor 112 connected between a second node N2 and the ground node GND.

The VTC circuit 100-1 further includes a first PMOS transistor MP1 having a source connected to a power supply node VDD and a drain connected to the second node N2, and a first NMOS transistor MN1 having a source connected to the ground node GND and a drain connected to the second node N2.

The VTC circuit 100-1 further includes a second NMOS transistor MN2 having a source connected to the ground node GND and a drain connected to the second node N2.

The VTC circuit 100-1 further includes a first switch 121 providing an input voltage $V_1$ to the first node N1, a second switch 122 connecting the first node N1 to a gate of the first NMOS transistor MN1, and a third switch 123 connecting the first node N1 to a gate of the first PMOS transistor MP1, and a fourth switch 124 having one terminal connected to the second node N2.

The VTC circuit 100-1 further includes a first inverter 131 connected to the second node N2, and a second inverter 132 and a third inverter 133 connected in series to the other terminal of the fourth switch 124.

The first switch 121 is controlled by a first switching signal S1, the third switch 123 is controlled by a second switching signal S2, and the second switch 122 and the fourth switch 124 are controlled by a third switching signal S3.

Figure 6B:
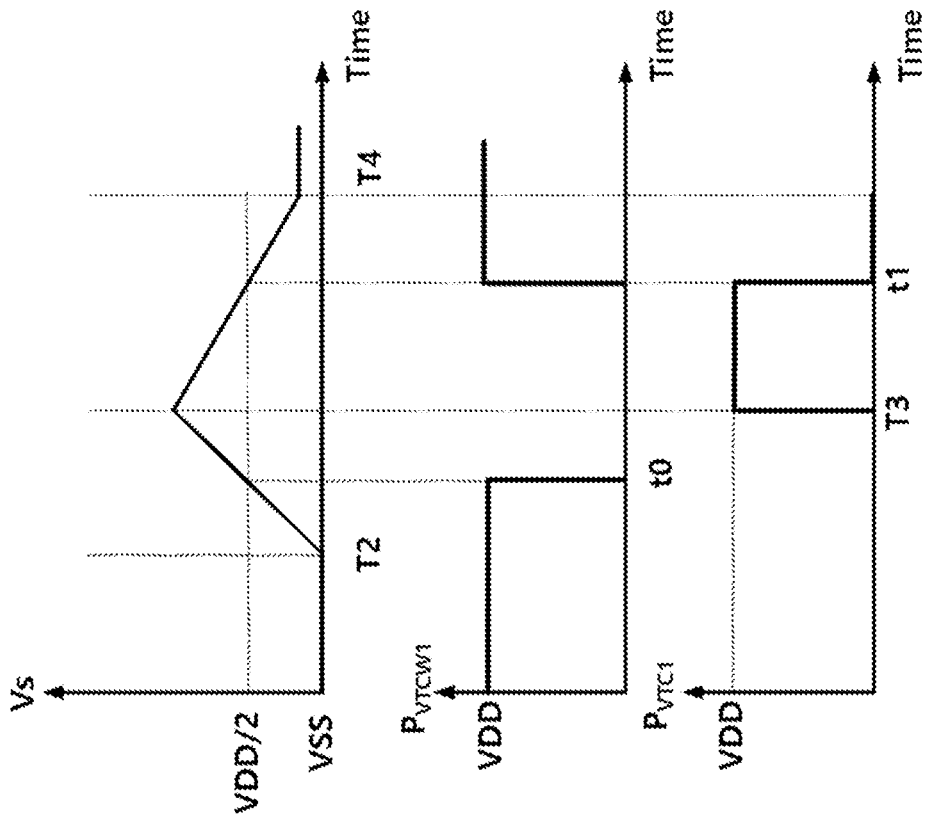
FIGS. 6A and 6B are graphs showing an operation of a voltage-to-time converter circuit of FIG. 5.
Figure 6A:
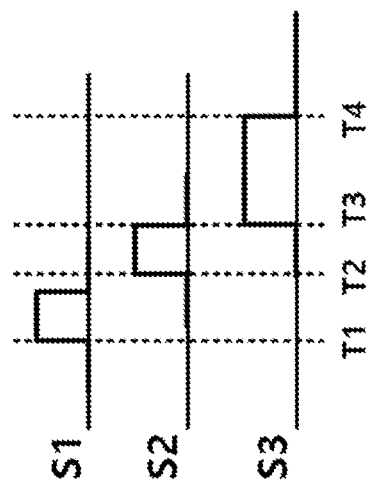

FIGS. 6A and 6B are graphs showing an operation of the VTC circuit 100-1 of FIG. 5.

FIG. 6A shows the first switching signal S1, the second switching signal S2, and the third switching signal S3, and FIG. 6B shows an output voltage Vs at the second node N2, an extended time signal $P_{VTCW1}$, and a time signal $P_{VTC1}$ when the first to the third switching signals S1 to S3 shown in FIG. 6A are provided to the VTC circuit 100-1.

The first switching signal S1 is a pulse signal transitioning to the high level at a time T1, the second switching signal S2 is a pulse signal transitioning to the high level at a time T2 after the time T1, and the third switching signal S3 is a pulse signal transitioning to the high level at a time T3 after the time T2.

A charging operation of the input capacitor 111 and a discharging operation of the output capacitor 112 are performed when the first switching signal S1 is at the high level, and a first operation of the VTC circuit 100-1 is performed when the second switching signal S2 is at the high level, and a second operation of the VTC circuit 100-1 is performed when the third switching signal S3 is at the high level.

In this embodiment, it is preferable that the first operation and the second operation do not overlap, and accordingly, it is desirable that the second switching signal S2 transitions to the low level when the third switching signals S3 transitions to the high level.

The input capacitor 111 is charged when the first switching signal S1 is at the high level. In the present embodiment, it is assumed that a period in which the first switching signal S1 is at the high level is long enough so that a voltage of the first node N1 becomes equal to the input voltage $V_1$ after charging the input capacitor 111.

When the first switching signal S1 is at the high level, the second NMOS transistor MN2 is turned on to discharge the output capacitor 112. In this embodiment, it is assumed that the period in which the first switching signal S1 is at the high level is sufficiently long so that the output voltage Vs becomes equal to the ground voltage VSS.

When the second switching signal S2 transitions to the high level at the time T2, the third switch 123 is turned on and thus the input voltage $V_1$ is applied to the gate of the first PMOS transistor MP1. Accordingly, current corresponding to the input voltage $V_1$ flows through the first PMOS transistor MP1 to charge the output capacitor 112. As a result, a level of the output voltage Vs increases.

When the third switching signal S3 transitions to the high level at the time T3, the second switch 122 is turned on and thus the input voltage $V_1$ is applied to the gate of the first NMOS transistor MN1. Accordingly, current corresponding to the input voltage $V_1$ flows through the first NMOS transistor MN1 to discharge the output capacitor 112. As a result, the level of the output voltage Vs decreases.

Since the time when the third switching signal S3 transitions to the high level is substantially the same as the time when the second switching signal S2 transitions to the low level, the output voltage Vs increases between the time T2 and the time T3 and begins to decrease at the time T3, as shown in FIG. 6B.

At a time T4, the third switching signal S3 transitions to the low level, and thus the second switch 122 is turned off. After the time T4, the output voltage Vs maintains its level as determined at the time T4.

The first inverter 131 inverts the output voltage Vs and outputs an extended time signal $P_{VTCW1}$ corresponding to the input voltage $V_1$.

Accordingly, in FIG. 6B, the extended time signal $P_{VTCW1}$ is generated as a low-level pulse during a period between a time to and a time t1, in which the output voltage Vs is higher than a threshold voltage of the inverter 131. In this embodiment, it is assumed that the threshold voltage is VDD/2.

The second inverter 132 and the third inverter 133 sequentially invert the output voltage Vs during a period in which the third switching signal S3 is at the high level to generate a time signal $P_{VTC1}$ corresponding to the input voltage $V_1$.

Accordingly, the time signal $P_{VTC1}$ has the high level between the time T3 and the time t1.

After the time T2, a slope of the output voltage Vs varies according to the magnitude of the input voltage $V_1$. For example, as the magnitude of the input voltage $V_1$ becomes smaller, discharging current flowing through the first NMOS transistor MN1 becomes smaller and charging current flowing through the first PMOS transistor MP1 becomes larger, so that the time to gets farther from the time T2 and the time t1 gets closer to the time T3.

In this embodiment, the time T3 at which the second operation starts is controlled by the control circuit 20 of FIG. 1.

If a period for performing the first operation is significantly long, it is difficult to make a sufficient change in the level of the output voltage Vs according to the input voltage $V_1$ at the time when the second operation starts because the output capacitor 112 is fully charged regardless of the level of the input voltage $V_1$. Accordingly, a problem may occur in that the time t1 at which the time signal $P_{VTC1}$ transitions to the low level is not changed sufficiently by the input voltage $V_1$.

Accordingly, in the present embodiment, the control circuit 20 observes a plurality of extended time signals $P_{VTCW1}$ to $P_{VTCW10}$ respectively corresponding to a plurality of input voltages $V_1$ to $V_{10}$, and when the number of extended time signals transitioning to the low level becomes a predetermined number, for example, 5, the first operation may be terminated and the second operation may start.

The control circuit 20 may control the time T4 at which the second operation is terminated.

As shown in FIGS. 6A and 6B, when a certain period has elapsed after the time T3, one of the extended time signals $P_{VTCW1}$ to $P_{VTCW10}$ transitions to the high level. Consequently, a corresponding time signal transitions to the low level.

The control circuit 20 may end the second operation by transitioning the third switching signal S3 to the low level when a predetermined number of extended time signals transition to the high level.

As described above, in this embodiment, since the phase transition of the time signal depends both on the discharging operation by the first NMOS transistor MN1 and on the charging operation by the first PMOS transistor MP1, the linearity according to the input voltage is improved.

Figure 7:
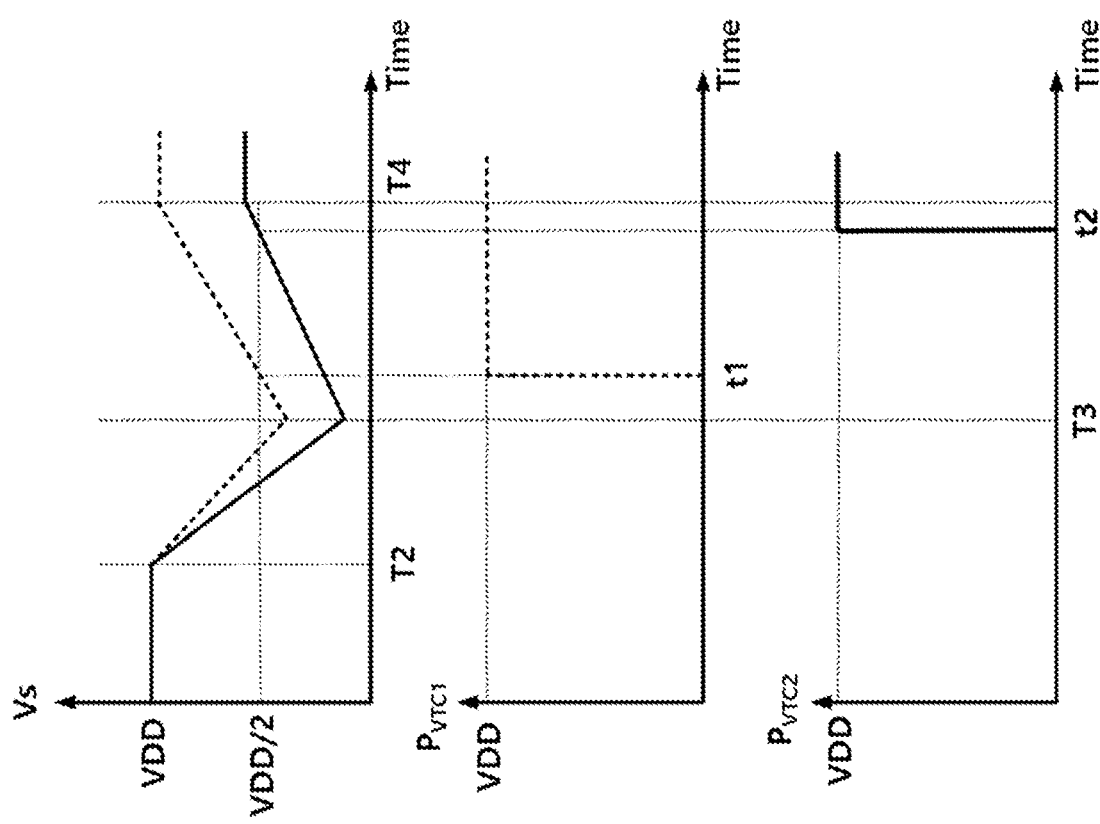
FIG. 7 is a graph showing an effect of an embodiment of the present disclosure.

FIG. 7 is a graph showing an effect of an embodiment.

The graph of FIG. 7 is based on the embodiment shown in FIG. 3, and corresponds to a case where the first input voltage $V_1$ is lower than a second input voltage V2.

In the graph, the dotted line corresponds to the first input voltage $V_1$, and the solid line corresponds to the second input voltage V2.

The first time signal $P_{VTC1}$ corresponding to the first input voltage $V_1$ transitions to the high level at a time t1, and a second time signal $P_{VTC2}$ corresponding to the second input voltage V2 transitions to the high level at a time t2.

In the embodiment of FIG. 3, discharging current flowing through the first NMOS transistor MN1 increases and charging current flowing through the first PMOS transistor MP1 decreases as a level of an input voltage increases.

Accordingly, as the level of the input voltage increases, as shown in FIG. 7, the amount of voltage drop increases during a first operation time and the amount of voltage rise decreases during a second operation time.

Accordingly, in the present embodiment, a time difference corresponding to a level change in the input voltage, that is, a time difference between the time t1 and the time t2, increases more significantly than that of the prior art, thereby reducing the possibility of malfunction.

Although various embodiments have been illustrated and described, various changes and modifications may be made to the described embodiments without departing from the spirit and scope of the invention as defined by the following claims.

What is claimed is:

1. A voltage-to-time converter (VTC) circuit comprising:
   an input capacitor being charged according to an input voltage during a precharge operation;
   an output capacitor being charged during the precharge operation;
   a first transistor configured to discharge the output capacitor according to a voltage charged in the input capacitor during a first operation following the precharge operation;
   a second transistor configured to charge the output capacitor according to the voltage charged in the input capacitor during a second operation following the first operation; and
   a plurality of inverters configured to generate a time signal by buffering a voltage charged in the output capacitor, during the second operation.

2. The VTC circuit of claim 1, further comprising an inverter configured to output an extended time signal by buffering the voltage charged in the output capacitor.

3. The VTC circuit of claim 1, further comprising a third transistor configured to charge the output capacitor to a power supply voltage during the precharge operation.

4. A voltage-to-time converter (VTC) circuit comprising:
   an input capacitor being charged according to an input voltage during a precharge operation;
   an output capacitor being discharged during the precharge operation;
   a first transistor configured to charge the output capacitor according to a voltage charged in the input capacitor during a first operation following the precharge operation;
   a second transistor configured to discharge the output capacitor according to the voltage charged in the input capacitor during a second operation following the first operation; and
   a plurality of inverters configured to generate a time signal by buffering a voltage charged in the output capacitor, during the second operation.

5. The VTC circuit of claim 4, further comprising an inverter configured to output an extended time signal by buffering the voltage charged in the output capacitor.

6. The VTC circuit of claim 4, further comprising a third transistor configured to discharge the output capacitor during the precharge operation.

7. A semiconductor device comprising:
   a voltage-to-time converter (VTC) circuit array including a plurality of VTC circuits that perform a first operation and a second operation, generate a plurality of time signals whose phase change times are determined according to a plurality of input voltages, respectively, and generate a plurality of extended time signals according to the plurality of input voltages by performing the first operation;
   a control circuit configured to control the first operation and the second operation and to determine a time to initiate the second operation according to the plurality of extended time signals; and
   a deactivation circuit array including a plurality of deactivation circuits and configured to generate a plurality of output signals, wherein, among the plurality of output signals, an output signal corresponding to a time signal with the earliest phase change time is activated, while the remaining output signals are deactivated.

8. The semiconductor device of claim 7, wherein each of the plurality of VTC circuits includes:
   an input capacitor being charged according to an input voltage during a precharge operation;
   an output capacitor being charged during the precharge operation;
   a first transistor configured to discharge the output capacitor according to a voltage charged in the input capacitor during the first operation following the precharge operation;
   a second transistor configured to charge the output capacitor according to the voltage charged in the input capacitor during the second operation following the first operation;
   a plurality of inverters configured to generate a time signal by buffering a voltage charged in the output capacitor, during the second operation; and an inverter configured to output an extended time signal by buffering the voltage charged in the output capacitor.

9. The semiconductor device of claim 8, further comprising a third transistor configured to charge the output capacitor to a power supply voltage during the precharge operation.

10. The semiconductor device of claim 7, wherein each of the plurality of VTC circuits includes:
an input capacitor being charged according to an input voltage during a precharge operation;
an output capacitor being discharged during the precharge operation;
a first transistor configured to charge the output capacitor according to a voltage charged in the input capacitor during the first operation following the precharge operation;
a second transistor configured to discharge the output capacitor according to the voltage charged in the input capacitor during the second operation following the first operation;
a plurality of inverters configured to generate a time signal by buffering a voltage charged in the output capacitor, during the second operation; and
an inverter configured to output an extended time signal by buffering the voltage charged in the output capacitor.

11. The semiconductor device of claim 10, further comprising a third transistor configured to discharge the output capacitor during the precharge operation.

12. The semiconductor device of claim 7, wherein the control circuit terminates the first operation and starts the second operation when, among the plurality of extended time signals, a number of extended time signals whose phase are changed during the first operation is greater than or equal to a first predetermined number.

13. The semiconductor device of claim 12, wherein the control circuit terminates the second operation when, among the plurality of extended time signals, a number of extended time signals whose phase are changed during the second operation is greater than or equal to a second predetermined number.

14. The semiconductor device of claim 7, wherein each of the plurality of deactivation circuits generates an output signal by using a corresponding time signal and a plurality of intermediate output signals corresponding to a plurality of time signals except the corresponding time signal,
wherein each of the plurality of deactivation circuits includes:
a NAND gate configured to generate an intermediate output signal corresponding to the corresponding time signal; and
an inverter configured to generate the output signal by inverting the intermediate output signal,
wherein the NAND gate receives, as inputs, the corresponding time signal and the plurality of intermediate output signals.

* * * * *